United States Patent
Niwa et al.

(10) Patent No.: US 6,541,813 B1
(45) Date of Patent: Apr. 1, 2003

(54) CAPACITOR AND METHOD FOR MANUFACTURING THE SAME

(75) Inventors: Shoko Niwa, Yokohama (JP); Hiroshi Tomita, Yokohama (JP); Kazuhiro Eguchi, Chigasaki (JP); Katsuhiko Hieda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/650,746

(22) Filed: Aug. 30, 2000

(30) Foreign Application Priority Data

Aug. 31, 1999 (JP) .............................. 11-246169

(51) Int. Cl.[7] ..................... H01L 29/76; H01L 27/108
(52) U.S. Cl. ..................... 257/310; 257/295; 438/239; 438/240
(58) Field of Search ................. 438/239, 240, 438/3, 392, 393, 785; 257/295, 310; 148/247, 284, 537

(56) References Cited

U.S. PATENT DOCUMENTS 6,171,898 B1 * 1/2001 Crenshaw et al. .......... 438/240
6,294,420 B1 * 9/2001 Tsu et al. .................... 438/239

FOREIGN PATENT DOCUMENTS

JP   7-297364   11/1995
JP   8-139043   5/1996

OTHER PUBLICATIONS

Vaquila, I. et al., "Oxidation Process in Titanium Thin Films", Physical Review, vol. 55, No. 20, pp. 13925–13931, May 1997.

* cited by examiner

*Primary Examiner*—Steven Loke
*Assistant Examiner*—Donghee Kang
(74) *Attorney, Agent, or Firm*—Finnegan, Henderson, Farabow, Garrett & Dunner, L.L.P.

(57) ABSTRACT

The capacitor related to the present invention has a lower electrode, a dielectric film provided on the lower electrode and made mainly of crystal containing at Ti, O and at least one element selected from the group consisting of Ba and Sr, and an upper electrode provided on the dielectric film, wherein the dielectric film includes a layer which contacts the upper electrode. In case the dielectric film which has a thickness of at least 5 nm and exhibits a first-order differential spectrum measured by means of Auger electron spectroscopy, and the in the first-order differential spectrum, a ratio A/B is at most 0.3, where A is the absolute value A of a difference between a third peak appearing near 420 eV and a fourth peak appearing at a higher energy level and near the third peak, and B is the absolute value B of a difference between a first peak appearing near 410 eV and a third peak appearing at a lower energy level and near the first level.

6 Claims, 8 Drawing Sheets

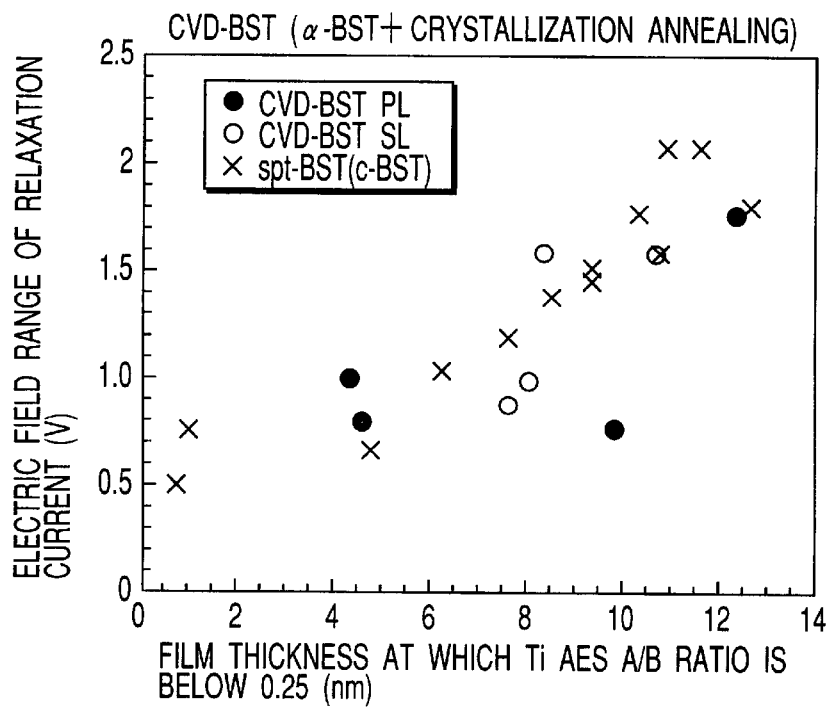
F I G. 10
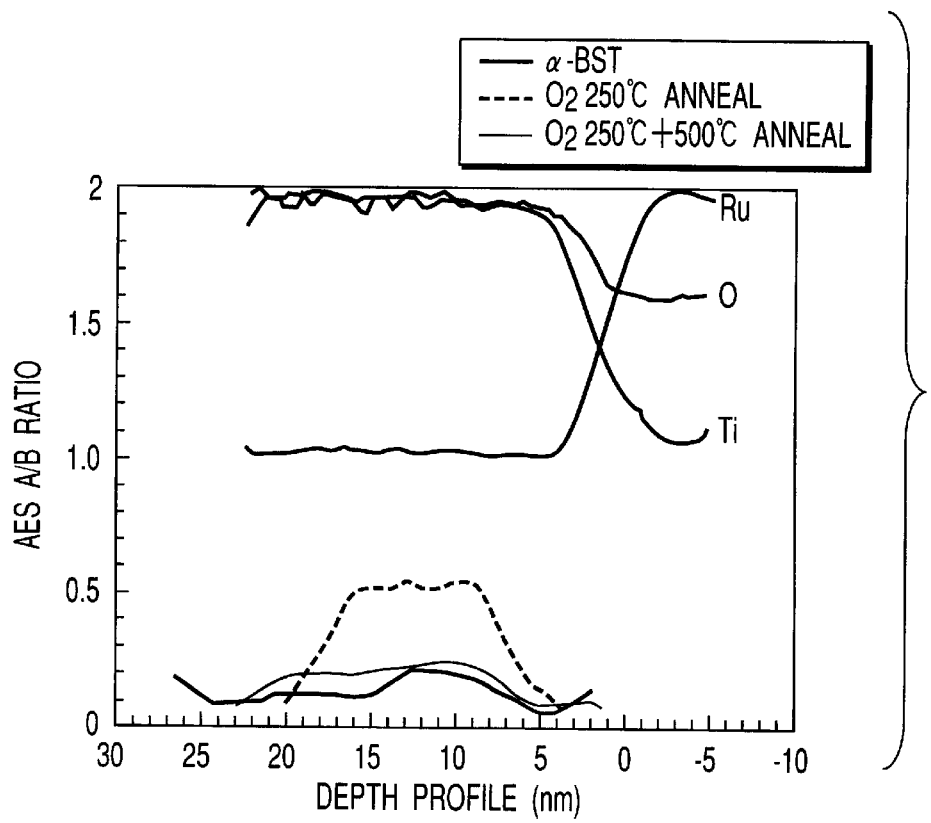
F I G. 11

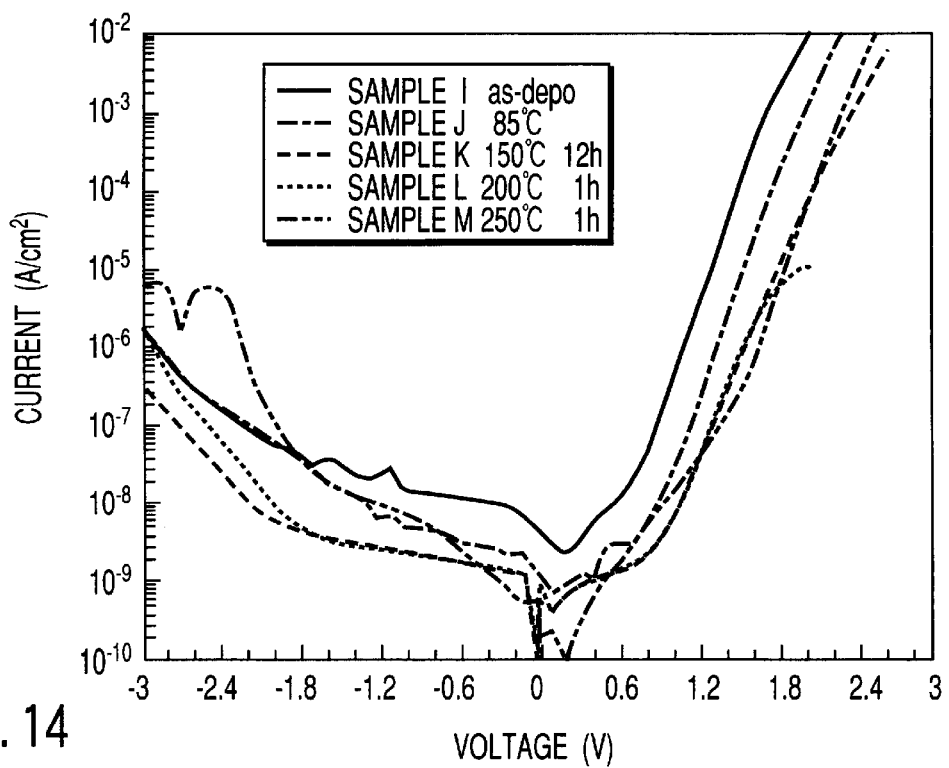
F I G. 14
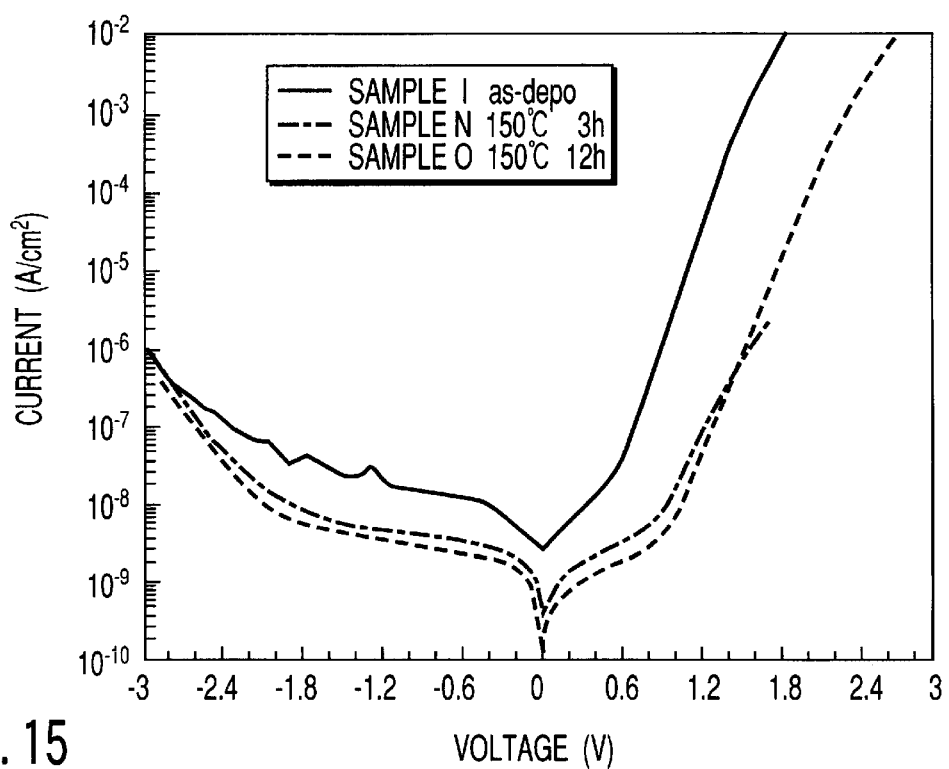
F I G. 15

CAPACITOR AND METHOD FOR MANUFACTURING THE SAME

CROSS-REFERENCE TO RELATED APPLICATIONS

This application is based upon and claims the benefit of priority from the prior Japanese Patent Application No. 11-246169, filed Aug. 31, 1999, the entire contents of which are incorporated herein by reference.

BACKGROUND OF THE INVENTION

The present invention relates to a capacitor having a dielectric film containing at least either Ba or Sr materials in addition to Ti and O, and method for manufacturing the capacitor.

With the miniaturization and high integration of electronic devices, it is becoming difficult to attain the functions of electronic devices by merely circuit composition alone. For instance, it is becoming extremely difficult to realize SRAM, EEPROM which conduct memory operation of information by combining it with transistors, or semiconductor memories that conduct memory operation of information by combining transistors and capacitors with the conventional MOS transistor or conventional MOS transistor and MOS capacitor since there is a trend to reduce the size of the memory cells composing such elements.

In particular, in the case of semiconductor memory that uses MOS capacitor, it becomes extremely difficult to continue securing a certain capacitance in order not to lower the SN ratio of the signals read out even if the minimum fabrication dimensions of the elements become small. Thus, instead of achieving the functions of the electronic devices by merely the circuit composition alone, the utilization of the characteristics of the material itself by using functional films is becoming effective.

For instance, as capacitor insulation film of the MOS capacitor, the adoption of insulation films comprising functional materials such as $Ba_XSr_{1-X}TiO_3$ [0<X<1] (BST), $SrTiO_3$ (STO), $BaTiO_3$ (BTO) which have higher dielectric constants than the silicone oxide films or silicone nitride films, is being studied. Since the above-mentioned BST, STO, and BTO reveal dielectric constants exceeding several hundreds at room temperature, they become promising as dielectric films for DRAM of which the securing of sufficient capacitor area is becoming difficult if improvement in the degree of integration is to be advanced.

In case of forming capacitor elements for semiconductor integrated circuits having high degree of integration by using BST of hypercomplex system, as a deposition method of BST, the chemical vapor deposition method (CVD Method) is suitable. In other words, by using the CVD method, since accurate controllability of the composition, reproducibility of the process, and excellent coverage of level difference can be obtained. Thus, the reliability of the electronic devices can be improved considerably.

In order to form BST films that are metal oxide films of hypercomplex system, feed rate-controlling conditions of which the control of composition is easy, are generally used. However, in the case of CVD method of the feed rate-controlling, the level difference coverage will drop. Thus, formation of BST films based on the reaction rate-controlling CVD method has been proposed. (Japanese Patent Application No. 7-50104)

However, in case films are formed by the MO-CVD method at a temperature below 500° C. that is the actual reaction rate-controlling condition, the organic substances in the raw material gases remain in the film after crystallization, and cause an increase in the leakage current.

Furthermore, unless sufficient oxygen is supplied at the time the film is formed, oxygen deficiency occurs in the film after crystallization, and there were problems such as causing increase in leakage current.

As a result, in the vicinity of practical electric field of about 1V, there were problems that a leakage current of $1 \times 10^{-7}$ $A/cm^2$ or less could not be achieved at a film thickness of 30 nm, and a dielectric constant of 300 or above, normally used for the memory devices of 1G bit generation and after.

BRIEF SUMMARY OF THE INVENTION

The object of the present invention is to provide a manufacturing method for a capacitor that suppresses the increase in leakage current by controlling the organic residues in the film even in case the dielectric film deposited in an amorphous state is crystallized in a dielectric film containing at least either Ba or Sr materials in addition to Ti and O.

Furthermore, another objective of the present invention is to provide a capacitor having a leakage current of $1 \times 10^{-7}$ $A/cm^2$ or less at about 1V.

The present invention is composed as mentioned below in order to achieve the aforementioned objectives.

(1) The capacitor related to the present invention has a lower electrode, a dielectric film provided on the lower electrode and made mainly of crystal containing at Ti, O and at least one element selected from the group consisting of Ba and Sr, and an upper electrode provided on the dielectric film; wherein the dielectric film includes a layer which contacts the upper electrode. In case the dielectric film which has a thickness of at least 5 nm and exhibits a first-order differential spectrum measured by means of Auger electron spectroscopy, and the in the first-order differential spectrum, a ratio A/B is at most 0.3, where A is the absolute value A of a difference between a third peak appearing near 420 eV and a fourth peak appearing at a higher energy level and near the third peak, and B is the absolute value B of a difference between a first peak appearing near 410 eV and a third peak appearing at a lower energy level and near the first level.

Desirable embodiments of the capacitor related to the present invention are described below.

(1a) The crystal is one selected among $Ba_XSr_{1-X}TiO_3$, $SrTiO_3$, and $BaTiO_3$.

(1b) The upper electrode contains one element selected from the group consisting of Sr, Ru, Pt, or O.

(2) A method of manufacturing a capacitor related to the present invention, comprising the steps of: forming a lower electrode; depositing a dielectric film on the lower electrode, the dielectric film having an amorphous structure made mainly of crystal containing at Ti, O and at least one element selected from the group consisting of Ba and Sr; annealing the dielectric film in an oxidizing atmosphere at a temperature lower than crystallization point of the amorphous structure; annealing the dielectric film at a temperature equal to or higher than the crystallization point of the amorphous structure, thereby crystallizing the amorphous structure; and depositing an upper electrode on the dielectric film.

Desirable embodiments of the capacitors related to the present invention are described below:

(2a) The dielectric film is an amorphous—structure film selected from among $Ba_XSr_{1-X}TiO_3$, $SrTiO_3$, and $BaTiO_3$.

(2b) The step of depositing the upper electrode is conducted in an atmosphere containing oxygen.

The upper electrode is made of one element selected from the group consisting of Sr, Ru and Pt.

(2c) The upper electrode is annealed in an oxidizing atmosphere after the upper electrode is deposited. The annealing may be performed, not after the upper electrode is processed and an inter layer insulating film is deposited on the upper electrode processed.

The upper electrode comprises at least one material from the group consisting of Sr, Ru and Pt, in addition to a material containing O.

The upper electrode is annealed at a temperature ranging of 85° C.–300° C.

Based on the above composition, the present invention possesses the following action and effect.

After forming a dielectric film in the amorphous state, by conducting annealing at a temperature below the crystallization point in an oxygen atmosphere, the organic substances in the film are released. Subsequently, by conducting annealing at a temperature above the crystallization point, a dielectric film containing no organic residues can be formed, and the increase in leakage current can be suppressed.

Furthermore, by forming an upper electrode containing one substance out of Sr, Ru, Pt, and O in the upper electrode, or by forming a film with Sr, Ru, and Pt in an atmosphere containing oxygen, the oxygen deficiency of the dielectric film can be suppressed.

By the dielectric film in contact with the upper electrode having a film thickness of 5 nm or above, and the ratio of A/B obtained by the AES being 0.3, the voltage range in the relaxation current region will be broadened, and it is possible to achieve a leakage current of $1 \times 10^{-7}$ A/cm$^2$ or less at around 1V.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a drawing that shows the electric field range of the relaxation current electric field region versus the surface layer thickness when the A/B value is 0.3 or less;

FIG. 11 is a characteristic drawing that shows the AES profile and the depth dependency of A/B of the BST film;

FIG. 14 is a drawing that shows the current-voltage characteristic of the sample related to the Second Embodiment;

FIG. 15 is a drawing that shows the current-voltage characteristic of the sample related to the Second Embodiment;

DETAILED DESCRIPTION OF THE INVENTION

The embodiments of the present invention are explained by referring to the following drawings.

First Embodiment

In order to remove the organic substances contained in a $Ba_xSr_{1-x}TiO_3$ [0<X<1] film, after depositing an amorphous state BST film (α-BST Film) by the MO-CVD method, the inventors of the present invention considered that it would be effective if a two-step annealing method in which the film is heated to a temperature below the crystallization point to conduct low temperature oxygen annealing for removing organic substances in the film, then heated to a temperature above the crystallization point to conduct crystallization annealing.

Actually, an BST film was formed by this two-step annealing method, and a sample formed by sputtering, subjected to crystallizing annealing only and not subjected to low-temperature annealing (i.e., non two-step annealing) was formed, too. The BST film was evaluated in comparison with the sample.

Figure 1:
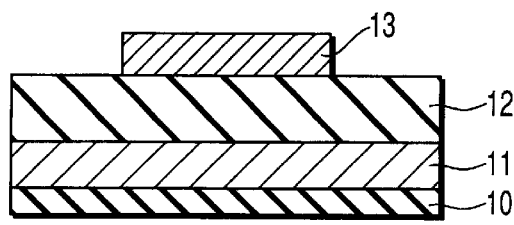
FIG. 1 is a cross sectional view showing the structure of a capacitor related to the First Embodiment.

In FIG. 1, a cross-sectional view of a capacitor that possesses BST film is shown.

As shown in FIG. 1, on the interlayer insulation film 10 formed on a semiconductor substrate (not illustrated), BST film 12 is formed via the lower electrode 11. On top of the BST film 12, the upper electrode 13 is formed.

Next, an explanation is given on the details of each sample.

(Details of Each Sample)

First of all, an explanation is given on the formation of a capacitor (Sample A) that adopts a BST film that underwent a two-step annealing process against an α-BST film formed by the MO-CVD method.

Sample A: BST film formed by the two-step annealing method.

Figure 2:
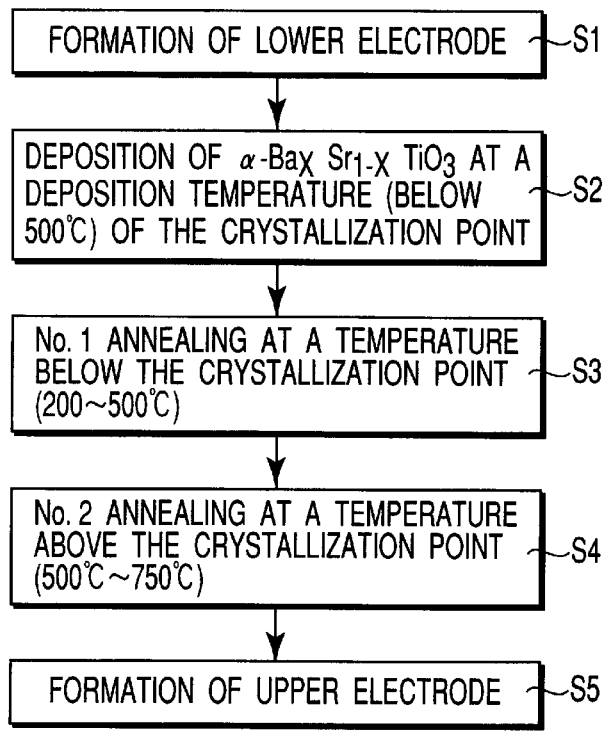
FIG. 2 is a flow-chart for explaining the manufacturing process of the capacitor.

An explanation is given on the capacitor manufacturing process by referring to the flow chart shown in FIG. 2.

First of all, deposit a SrRuO$_3$ film by using the sputtering method, and form the lower electrode (Step S1). Next, form an α-BST film by using the MO-CVD method (Step S2) at a deposition temperature below the crystallization temperature. The deposition temperature is below 500° C., more preferably below 450° C.

The α-BST film is obtained through raw material gases obtained by sublimation of, for instance, Ba $(C_{11}H_{19}O_2)_2$ (Ba (THD)$_2$), Sr $(C_{11}H_{19}O_2)_2$ (Sr (THD)$_2$), Ti $(C_{11}H_{19}O_2)_2$ (i-OC$_3$H$_7$)$_2$ (Ti (THD)$_2$ (i-OPr)$_2$) are introduced into a reactor, and at the same time, Ar gas and O$_2$ gas are introduced into the reactor Subsequently, in order to remove the residual organic impurities contained in the α-BST film, the α-BST film is annealed in an oxidizing atmosphere at a temperature below the crystallization point, for instance, 250° C., in an atmosphere which contains oxygen. (Step S3)

In this low temperature oxygen-annealing process, a temperature below the crystallization point for instance, ranging of 200° C.–500° C., or more preferably ranging of 200° C.–300° C. As for the atmosphere, it is preferable to conduct the annealing process in an oxidation atmosphere such as reduced pressure oxygen, or normal pressure or pressurized oxygen.

Subsequently, in order to crystallize the α-BST film, the α-BST film is annealed in an atmosphere that contains oxygen at a temperature above the crystallization point, for instance, conduct crystallization annealing by heating it to 500° C., and form a crystallized BST film (c-BST film) (Step S4). The heating temperature at this crystallization annealing process shall be a temperature at which crystallization of BST occurs, for instance, 500° C. or above 750° C. or below. Furthermore, this crystallization annealing shall be conducted at a reduced pressure atmosphere or in a nitrogen atmosphere, or in an atmosphere containing oxygen. Subsequently, SrRuO$_3$ is deposited and processed, then the upper electrode is formed.

In the above process, Sample A formed from BST film was prepared. Furthermore, against the α-BST film sample A' which formed the upper electrode without conducting low temperature annealing and crystallization annealing was prepared at the same time.

Next, an explanation is given on the formation of a capacitor (Sample B) possessing BST film that has undergone crystallization annealing, against α-BST film which has been formed by the MO-CVD method.

[Sample B: A BST film formed by conducting only crystallization annealing.]

First of all, similar to Sample A, form SrRuO$_3$ electrode and the α-BST film in order.

Subsequently, heat them in a nitrogen atmosphere at 650° C. and crystallize the α-BST film. After conducting crystallization annealing, form c-BST film. Similar to the Sample A, form an upper electrode comprising SrRuO$_3$.

Next, an explanation is given on the capacitor (Sample C) undergoing low temperature oxygen annealing and crystallization annealing on c-BST film that has been formed by the sputtering method.

[Sample C: BST film formed by the sputtering method.]

First of all, similar to the Sample A, use the DC-sputtering method and form the SrRuO$_3$ lower electrode. Next, use the RF-sputtering method at a deposition temperature of 400° C. or above, and form a c-BST film. Next, against the C-BST film, similar to Sample A, in an atmosphere containing oxygen, after conducting low temperature oxygen annealing at a heating temperature of 250° C. conduct crystallization annealing at 500° C. or above. Subsequently, similar to the Sample A, form the upper electrode comprising SrRuO$_3$.

In the aforementioned process, Sample C that formed BST film was prepared. Furthermore, against BST film, low temperature annealing and Sample C that formed the upper electrode without conducting low temperature oxygen annealing and crystallization annealing, was prepared at the same time.

(Measurement of Current-Voltage Characteristics)

Measurements of current-voltage characteristics were conducted on the 5 samples prepared as mentioned above, and evaluation of leakage current was made.

Figure 3:
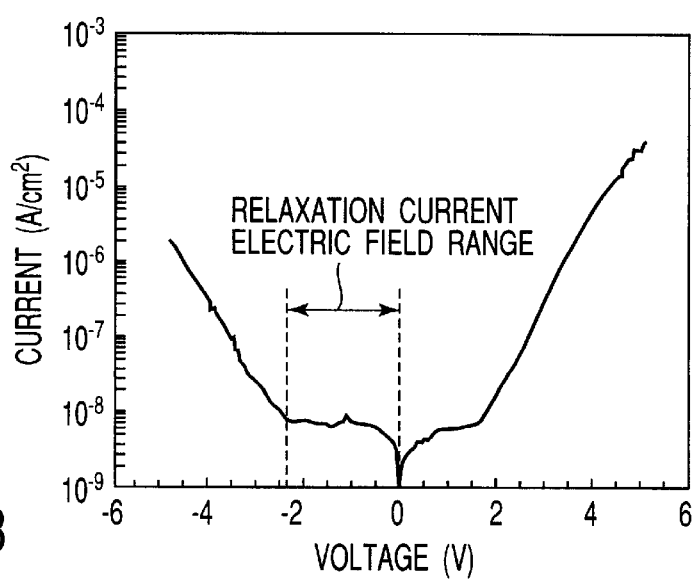
FIG. 3 is a drawing that indicates a typical current-voltage characteristic of BST film.

First of all, an explanation is given on a typical current-voltage characteristic of a BST film by referring to FIG. 3. FIG. 3 is a characteristic curve showing a typical current-voltage characteristic of a BST film.

In the current components of a BST film, there are at least two outstanding current component features. One of them is in the vicinity of the 0V region where the main current is a relaxation current. The relaxation current has low current density, and the current density hardly changes against the electric field. The electric field region in which the relaxation current flows is called the relaxation current region. Another current component is the electric field region existing above the relaxation current region, and it is a region which is dependent on the electric field density and which increases in current density.

Thus, if a BST film that has a leakage current density of $1 \times 10^{-7}$ A/cm$^2$ or less in the relaxation current region, and an electric field upper limit showing the relaxation current region to be 1V or above, is used, a high integration device of 1G bit equivalent to or above can be realized.

Next, an explanation is given on the measurement results of the current-voltage characteristic for the respective samples.

First, an explanation is given on Sample B. As a result of measuring Sample B on which crystallization annealing was conducted without conducting the low temperature oxygen annealing, the leakage current was very large in comparison with other samples. This shows that if crystallization process is conducted on α-BST film of which the removal of residual organic impurities are insufficient, carbon impurities remain in the film.

Figure 4:
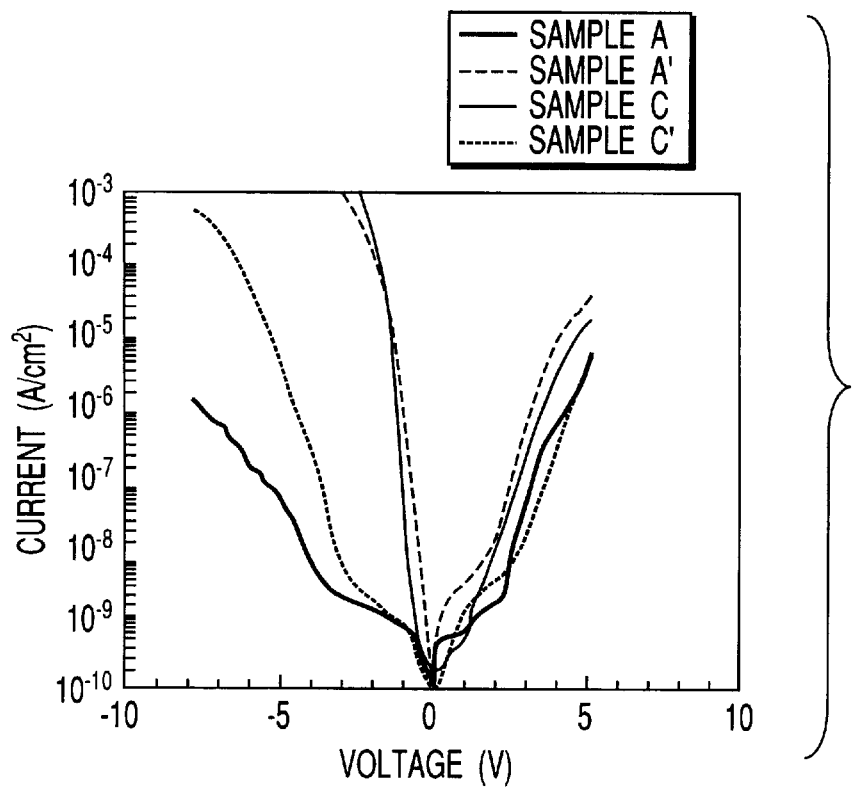
FIG. 4 indicates current-voltage measurement of BST film related to the First Embodiment.

Next, measurement results of current-voltage characteristics of Samples A, A' and Samples C, C' are shown in FIG. 4. As shown in FIG. 4 the leakage current was the lowest for Sample A that conducted low temperature oxygen annealing and crystallization annealing on α-BST film formed by the MO-CVD method, and in addition, the electric field range of the relaxation electric current region is narrow.

Thus, by conducting crystallization annealing after conducting low temperature annealing on the α-BST film, it has been confirmed that the electric field range of the relaxation electric current region broadens. Therefore, it is known that a capacitor possessing a BST film that has undergone a two step annealing on α-BST film can correspond to high integration devices equivalent to 1G bits.

(Density Measurement)

Densities were measured for Samples A, A', C and C'. Furthermore, the density of BST film having an ideal crystallization state is 5.5 g/cm$^3$.

Figure 5:
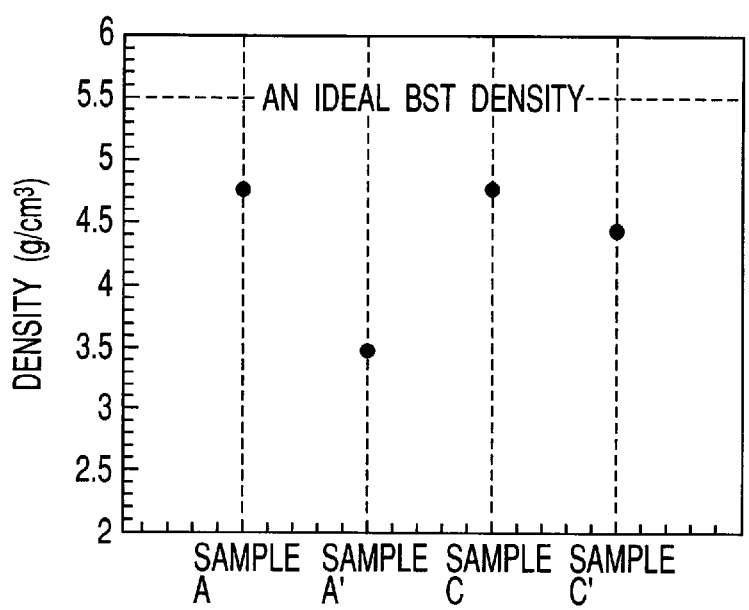
FIG. 5 is a drawing that shows the density of (Ba, Sr) TiO3 film samples related to the First Embodiment.

In FIG. 5 the results of density measurements for Samples A, A', C, and C' are shown. As shown in FIG. 5, the densities of Samples C and C' which possess BST film formed by the sputtering method are about 4.5–4.8 g/cm³ regardless of whether annealing was conducted or not.

The density of Sample A that conducted low temperature oxygen annealing and crystallization annealing in succession on α-BST film formed by the MO-CVD method increases considerably in comparison with the density of Sample A' (about 3.5 g/cm³) that was obtained prior to conducting the 2 step annealing, and it is about 4.8 g/cm³ or roughly the same as the density of Sample C formed by the sputtering method.

In case the deposition is conducted by the MO-CVD method with organo-metallic raw materials, BST films mixed with solvents and organic materials are formed. Thus, the density of incomplete BST films containing solvents and organic materials should become low. However, since the density has increased, it is obvious that the solvents and organic materials contained in the film were removed by the low temperature oxygen annealing. The densities of $SrTiO_3$ and $BaTiO_3$ which have achieved ideal crystallization states, are 4.8 g/cm³ and 6.2 g/cm³, respectively.

By conducting the 2 step annealing, it was confirmed that the solvents and organic materials contained in the film were removed by the 2 step annealing for both the $SrTiO_3$ and $BaTiO_3$, and similar to STO, the densities increased in comparison with those prior to annealing.

(AES Analysis)

As a result of measuring the current-voltage, it was found that there was a great difference in the leakage current level and the electric field range of the saturated current region between the BST film formed by the sputtering method and the BST film formed by the CVD method.

The crystals of $Ba_xSr_{1-x}TiO_3$, $SrTiO_3$ have a perovskite structure, and the oxygen which compose the BST exist in a face centered cubic lattice position with the Ti in center. In the actual BST film, a part of the oxygen is in a missing state. Thus, we considered that the differences in the current-voltage characteristics between the sputtered film and the CVD film were caused by the said missing oxygen. As for the amount of oxygen deficiency, a quantitative analysis can be made by the analysis based on Auger Electron Spectroscopy (AES)[I. Vaquila, M. C. G. Passeggi, Jr., and Ferron, Phys. Rev. B, 55, 13925 (1197)]. A first order differential spectrum based on AES was obtained for each Sample, and quantitative analysis was conducted on the oxygen deficiency.

Figure 6:
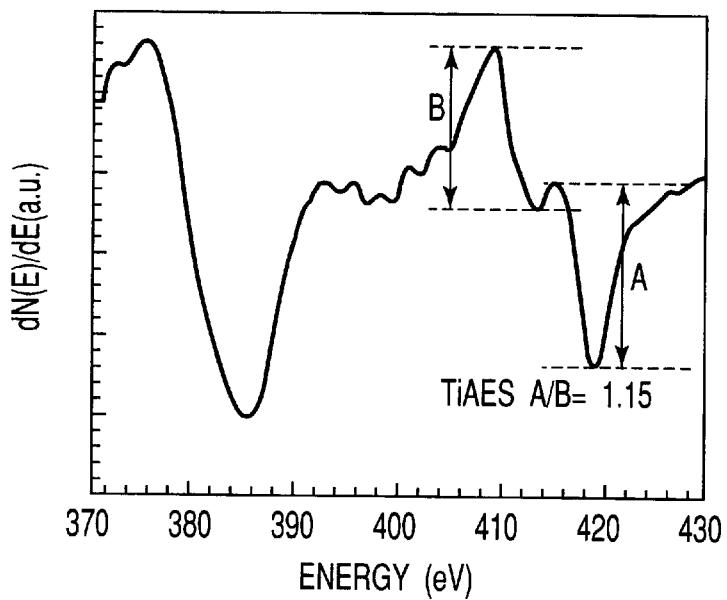
FIG. 6 is a drawing that shows the first order differential spectrum in the vicinity of 410 eV corresponding to the Ti measured by using AES on the general BST film.

In FIG. 6 a first order differential spectrum in the vicinity of 410 eV corresponding to the Ti measured by using AES of the general BST film is shown. As shown in FIG. 6, 4 peaks referred to as LMV exist between the vicinity of 410 eV and the vicinity of 420 eV.

In FIG. 6, the two peaks that appear in the vicinity of 410 eV are caused by the binding between Ti and oxygen. Furthermore, the two peaks that appear in the vicinity of 420 eV is caused by metallic Ti, and it is not caused by the binding with oxygen.

Therefore, the oxidization state of the BST film can be obtained by comparing the absolute value of B that is the absolute value of the difference between the upward convex No. 1 peak which appears near 410 eV, and the downward convex No. 2 peak which appears on the high energy side of No. 1 peak, and the absolute value of A that is the absolute value of the difference between the downward convex No. 3 peak which appears near 420 eV and the upward convex No. 4 peak which appears to the lower energy side of No. 3 peak, that is, a ratio (A/B).

As for the A/B of Ti oxides, in the case of $Ti_2O_3$ it is 2,2, in the case of TiO it is 0.5, and in the case of $SrTiO_3$, it is 0.22. It shows that the smaller the A/B the larger the number of bound oxygen.

Measurements were made by using AES on Samples A, A', and Samples C, C'. Furthermore, at the time of analysis, measurements were made on the spectrum versus the depth of the BST film by conducting the spectrum measurement based on AES while conducting sputtering of the BST film surface.

Figure 7:
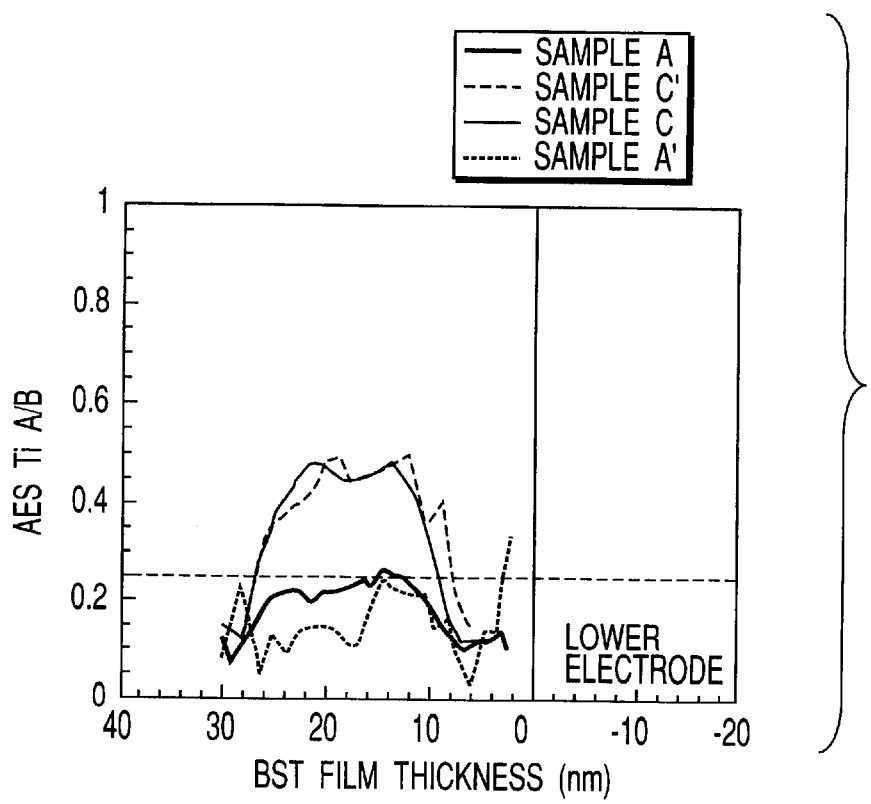
FIG. 7 is a drawing that shows the depth dependency of A/B of the BST film related to the First Embodiment.

The above-mentioned A/B was obtained at various depths. In FIG. 7 the depth dependency of the A/B obtained is shown. In FIG. 7, the film thickness of the horizontal axis indicates the boundary surface of the lower electrode as 0. It is believed that considerable error is contained in the measurement of lower electrode owing to the roughness of the lower electrode surface or over-etching of the BST film.

As shown in FIG. 7, A/B of Samples A, A' formed by the CDV method becomes 0.3 or less at all depths of the region., and it is evident that the oxygen deficiency is small. Furthermore, the Samples C, C' made by the sputtering method have high A/B for all depths of the region, and it shows that the oxygen deficiency is great.

Thus, in order to form a film having a broad relaxation current region, it is obvious that it is necessary to make the A/B less than 0.3.

Next, a more detailed observation was made on the depth dependency of A/B of Sample A and Sample A' shown in FIG. 7.

As shown in FIG. 7, near the surface of the BST film, the A/B value of Sample A having a broad electric field range of the relaxation current region becomes smaller. Contrary to this, in the inner region of BST film, A/B of Sample A' having a narrower electric field range of the relaxation current region becomes smaller than that of the Sample A.

From this matter, in order to broaden the electric field range of the relaxation current region, it is evident that it is important to make the A/B value near the surface low.

Figure 8:
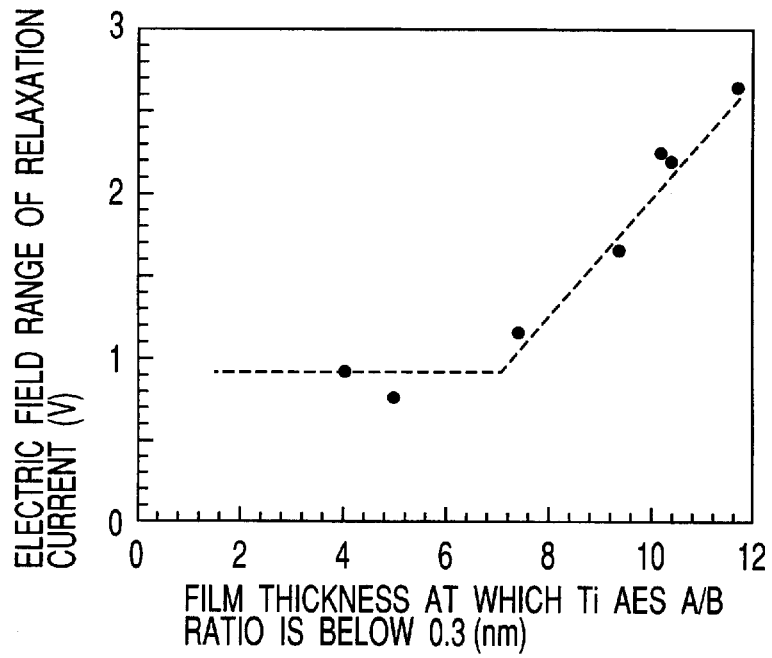
FIG. 8 is a drawing that shows the electric field range of the relaxation current electric field region versus the surface layer thickness when the A/B value is 0.25 or less.

Next, the range of the electric field generated from the relaxation current was measured with respect to the thickness of the surface layer having A/B value of 0.25 or less. FIG. 8 shows the results. As seen from FIG. 8, the range of the electric field expanded as the surface layer grew thicker to have an A/B value of 0.3 or less.

Figure 9:
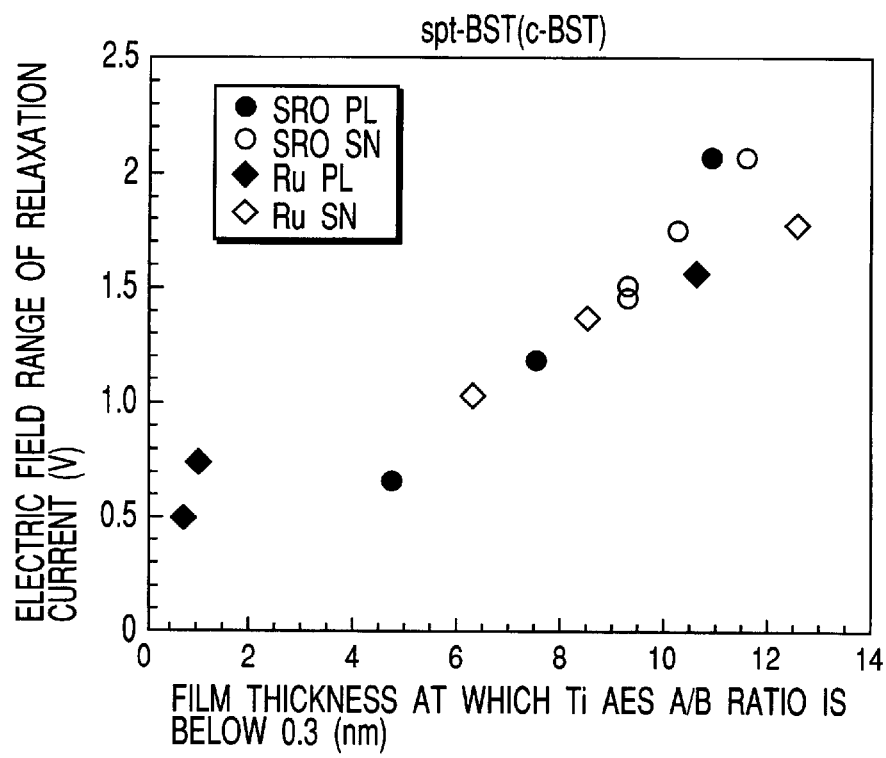
FIG. 9 is a drawing that shows the electric field range of the relaxation current electric field region versus the surface layer thickness when the A/B value is 0.3 or less.

Furthermore, also in the case of c-BST film that is formed by the sputtering method, measurements were taken for the electric field range of the relaxation current region versus the film thickness in which A/B becomes less than 0.3 in a similar manner. The results are shown in FIG. 9. The samples used in this measurement make use of $SrRuO_3$ or Ru as the upper electrode(PL) or the lower electrode(SN), and the measurements were conducted from the upper electrode side and the lower electrode side.

As shown in FIG. 9, regardless of the polarity of the electrodes or the material of the electrodes, with the increase in film thickness at which A/B becomes less than 0.3, it is evident that the electric field range of the relaxation current increases.

As shown in FIG. 9, in case the value of A/B exceeds 5–6 nm, the critical electric charge position of the saturation current electric field range becomes 1V or above.

Therefore, in order to use DRAM which has a broad critical current electric field range and which has 1G bits or above, it is desirable that the A/B value is 0.30 or below, and the surface layer thickness 5 nm, or above.

In addition, after forming the α-BST film by the MO-CVD method, the BST film was formed by conducting low temperature oxygen annealing and crystallization annealing, and in a similar way, measurements were taken on the voltage range of relaxation current region for film thickness at which A/B becomes less than 0.3. The results are shown in FIG. 10. Furthermore, FIG. 10 simultaneously shows the data of BST films formed by the sputtering method.

As shown in FIG. 10, as the thickness of the film at which A/B becomes less than 0.3 increases, it is obvious that the electric field of the relaxation current increases.

(Effect of Two-Step Annealing)

Next, an explanation is given on the effect of two-step annealing on α-BST film.

FIG. 11 shows characteristic curves that indicate AES profiles of the BST films and the depth dependency of A/B.

In FIG. 11, the measurement results of α-BST film, a sample on which crystallization annealing was conducted on α-BST film, and a sample on which two-step annealing was conducted on α-BST film, are shown.

As shown in FIG. 11, in case crystallization annealing is conducted on α-BST film, A/B increases, and it is evident that the oxygen deficiency is large. Contrary to this, by conducting crystallization annealing after conducting low temperature oxygen annealing, the increase in A/B can be suppressed, and it is evident that the oxygen deficiency is small.

It is considered that by conducting low temperature oxygen annealing, the organic impurities are removed, and in addition, the oxygen is compensated.

Figure 12:
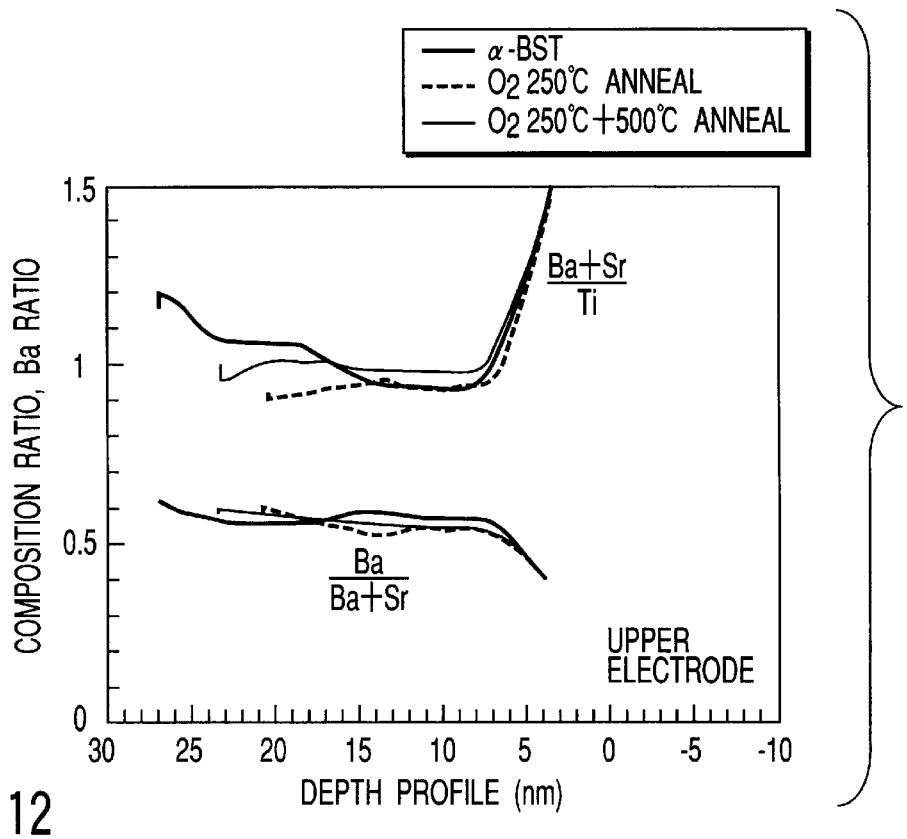
FIG. 12 is a characteristic drawing that shows depth dependency of the composition ratio in the BST film.

In FIG. 12, the depth dependency of the composition ratio in the BST film is shown. In FIG. 12, (Ba+Sr)/Ti and Ba/(Ba+Sr) are shown.

As shown in FIG. 12, it is evident that the variance in the composition that fluctuates in the direction of the film depth for α-BST film, becomes uniform in the case of samples that have undergone 2 step annealing. Thus, it is obvious that the low temperature oxygen annealing has the effect of making the fluctuation of composition in the film uniform.

The Second Embodiment

Next, an explanation is given on the influence that the electrode has on $Ba_xSr_{1-x}TiO_3$ film.

Moreover, the BST film was made by the RF sputtering method, and after forming a film at a temperature above the crystallization point, the film was heated at 650° C., and the dielectric constant was secured.

Next, an explanation is given for each Sample.

Sample D (SRO as-depo)

The upper and lower electrodes are $SrRuO_3$ films formed by the DC sputtering method. The deposition conditions for the $SrRuO_3$ film are:

Sputtering Gas: Ar
Discharge Power: 0.5 kW
Deposition Temperature: 500° C.

Sample E (SRO $O_2$ 300° C. 15 min.)

The upper and lower electrodes are $SrRuO_3$ films formed by the DC sputtering method. The deposition conditions are the same as those for Sample D, but after forming the upper electrode, annealing was conducted at 300° C. for 15 minutes in an atmosphere containing oxygen.

Sample F (SRO $O_2$ 300° C. 30 min.)

The upper and lower electrodes are $SrRuO_3$ films formed by the DC sputtering method. The deposition conditions are the same as those for Samples D and E, but after forming the upper electrode, annealing was conducted at 300° C. for 30 minutes in an atmosphere containing oxygen.

Sample G (Ru ($O_2$ 20%) as-depo)

The upper and lower electrodes are Ru films formed by the DC sputtering method. The deposition conditions for the Ru film are:

Sputtering Gas: Ar gas and $O_2$ gas
Discharge Power: 0.5 kW
Deposition Temperature: Room Temperature Furthermore, the flow of $O_2$ gas is set at 20% of the total flow.

Sample H (Ru ($O_2$ 0%) as-depo)

The upper and lower electrodes are Ru films formed by the DC sputtering method. The deposition conditions for the Ru film are:

Sputtering Gas: Ar gas
Discharge Power: 0.5 kW
Deposition Temperature: Room Temperature Sample I (Ru($O_2$ 20%) as-depo)

Both the lower electrode and the upper electrode are Ru films formed by DC sputtering. The upper electrode has been formed at room temperature, by using a mixture of Ar gas and $O_2$ gas as sputtering gas and by supplying discharge power of 0.5 kW. The accounted for 20% in volume of the gas mixture. The lower electrode has been formed in the same conditions as the upper electrode, except that the sputtering gas consists of only Ar gas.

Sample J (Ru($O_2$ 20%) 85° C. 1 hour)

The upper and lower electrodes are $SrRuO_3$ films formed by the DC sputtering method. The deposition conditions for $SrRuO_3$ film are the same as Sample I, but after forming the upper electrode, annealing was conducted at 85° C. for 1 hour in an atmosphere containing oxygen.

Sample K (Ru($O_2$ 20%) 150° C. 12 hours)

The upper and lower electrodes are $SrRuO_3$ films formed by the DC sputtering method. The deposition conditions for $SrRuO_3$ film are the same as Sample I, but after forming the upper electrode, annealing was conducted at 150° C. for 12 hours in an atmosphere containing oxygen.

Sample L (Ru($O_2$ 20%) 200° C. 1 hour)

The upper and lower electrodes are $SrRuO_3$ films formed by the DC sputtering method. The deposition conditions for $SrRuO_3$ film are the same as Sample I, but after forming the upper electrode, annealing was conducted at 200° C. for 1 hour in an atmosphere containing oxygen.

Sample M (Ru($O_2$ 20%) 250° C. 1 hour)

The upper and lower electrodes are $SrRuO_3$ films formed by the DC sputtering method. The deposition conditions for $SrRuO_3$ film are the same as Sample I, but after forming the upper electrode, annealing was conducted at 250° C. for 1 hour in an atmosphere containing oxygen.

Sample N (Ru($O_2$ 20%) 150° C. 3 hours)

The upper and lower electrodes are $SrRuO_3$ films formed by the DC sputtering method. The deposition conditions for $SrRuO_3$ film are the same as Sample I, but after forming the upper electrode, annealing was conducted at 150° C. for 3 hours in an atmosphere containing oxygen.

Sample O (Ru($O_2$ 20%) 150° C. 12 hours)

The upper and lower electrodes are $SrRuO_3$ films formed by the DC sputtering method. The deposition conditions for $SrRuO_3$ film are the same as Sample I, but after forming the upper electrode, annealing was conducted at 150° C. for 12 hours in an atmosphere containing oxygen.

(Measurement of Current-Voltage)

On 11 samples from Sample D to Sample O measurements on the current-voltage characteristics of the BST film were made, and evaluations on the leakage current and relaxation current region were conducted.

Figure 13:
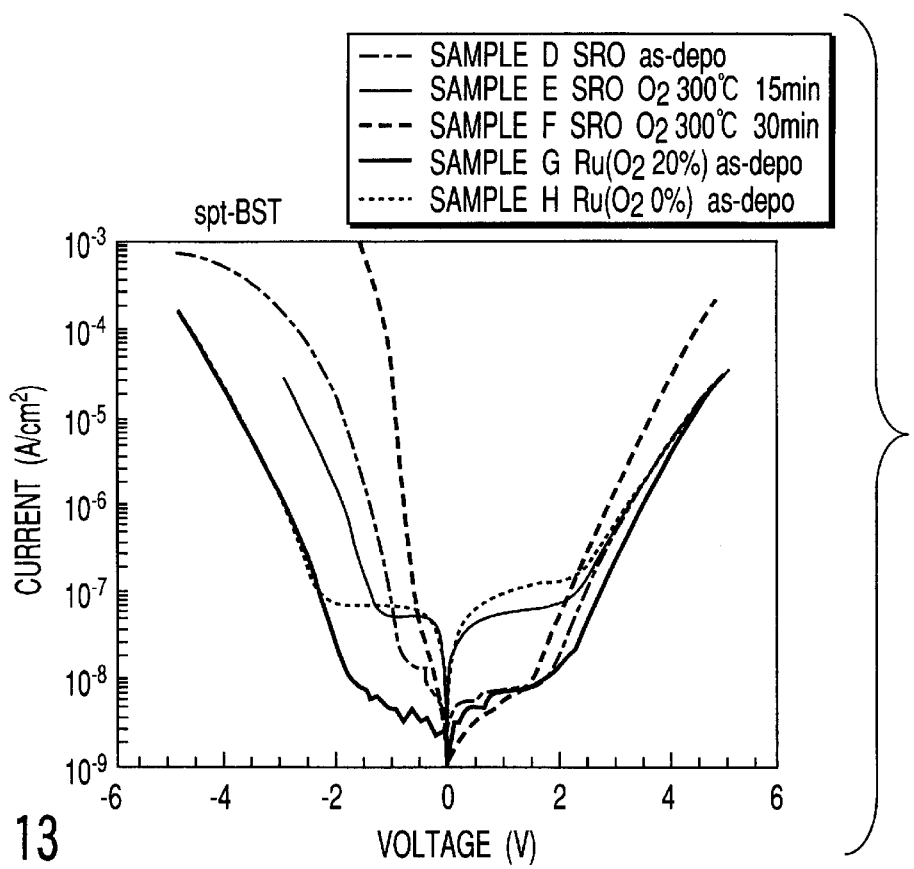
FIG. 13 is a drawing that shows the current-voltage characteristic of the sample related to the Second Embodiment.

FIGS. 13, 14, and 15 show the current-voltage characteristics of each Sample.

As shown in FIGS. 13, 14, and 15, it is evident that the leakage current is low for samples to which annealing was conducted at temperatures from 85° C. to 300° C.

As shown in FIG. 13, in an atmosphere containing oxygen, samples having low leakage current and samples having broad relaxation current-voltage regions are different.

The sample having the lowest leakage current is Sample G made by forming the film by the sputtering method by using a mixed gas of argon and oxygen. The sample having the broadest relaxation current-voltage region is Sample F formed by depositing $SrRuO_3$ electrode then conducting the annealing at 300° C. for 30 minutes in an atmosphere containing oxygen.

In case annealing is conducted after the upper electrode is formed, as shown in FIG. 14, the leakage current was lowest for Sample K and Sample L that conducted annealing at 200° C. and 150° C. Furthermore, as shown in FIG. 15, Sample M (150° C. 3 hours) in comparison with Sample N (150° C. 12 hours) the leakage current level is slightly higher. Thus, it is evident that if the annealing temperature is low, it takes time to lower the leakage level.

(AES Analysis)

Figure 16:
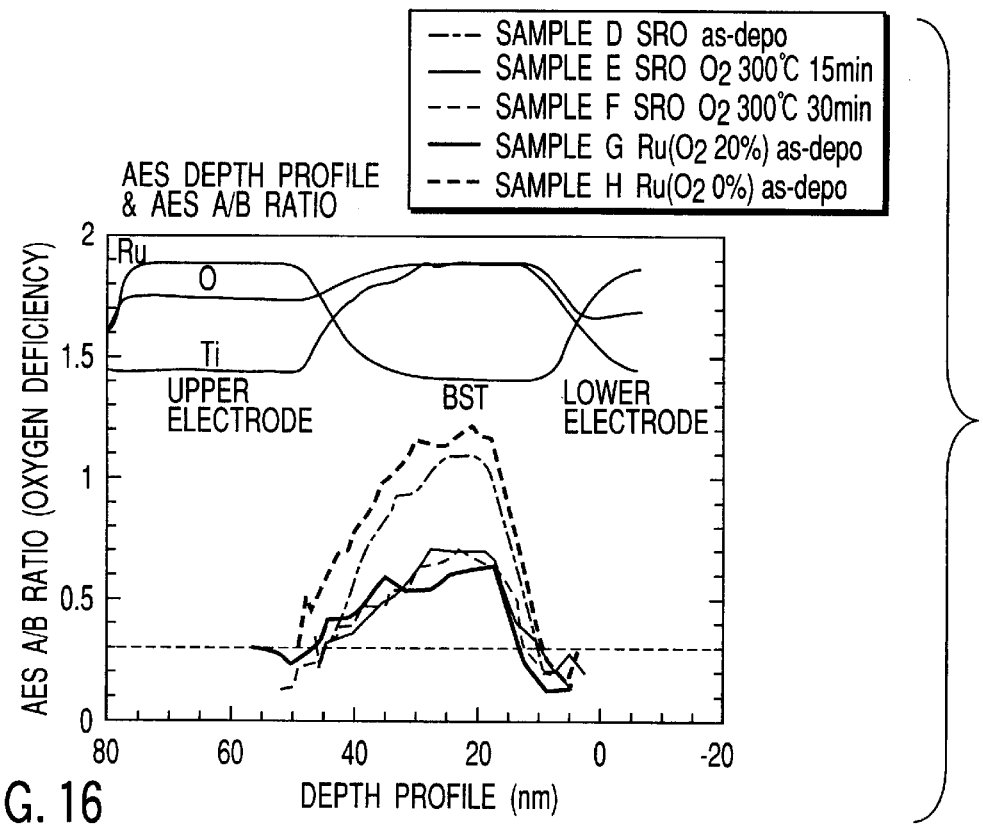
FIG. 16 is a drawing that shows the depth dependency of A/B for the BST film.
Figure 17:
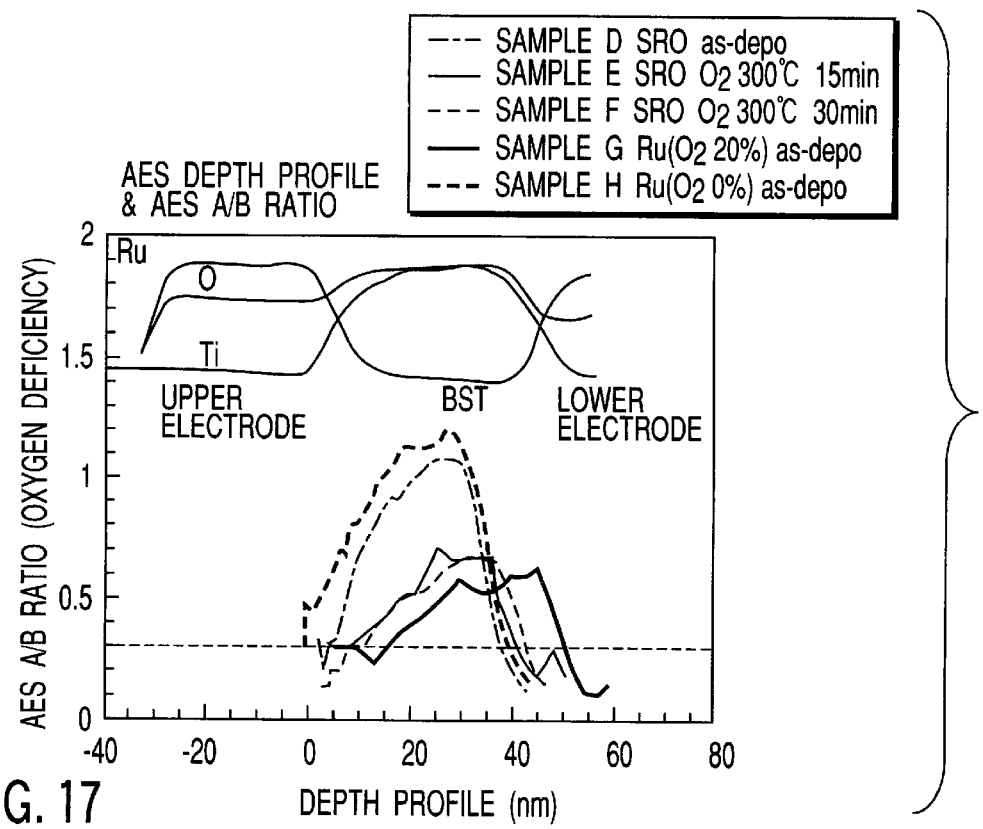
FIG. 17 is a drawing that shows the depth dependency of A/B for the BST film.

Next, AES Analysis was conducted on each sample of Sample D, Sample E, Sample F, Sample G, and Sample H, and similar to the First Embodiment, the aforementioned A/B was obtained for each depth. The depth dependencies of the A/B obtained are shown in FIGS. 16 and 17. As for the horizontal axes of FIGS. 16 and 17, since the film thickness of the samples varies, in the case of FIG. 16, the boundary of the lower electrode and BST film is made 0 nm, and in case of FIG. 17, the upper electrode and the boundary of the BST film is made 0 nm.

As shown in FIG. 16, the A/B of the lower electrode coincide with one another among Sample D, Sample E, and Sample F or between Sample G and Sample H. Contrary to this, as shown in FIG. 17, it is evident that the A/B of the upper electrode depends on the deposition process and the post-annealing.

In case comparisons are made between Sample G and Sample H that possess Ru films as lower and upper electrodes, it is obvious that Sample G that formed Ru film by adding oxygen to the sputtering gas has less oxygen deficiency on the electrode interface.

Furthermore, the A/B of the BST film for Sample D and Sample H is large, but the current level of the relaxation current region is lower than that of Sample E and Sample F. Thus, it is evident that the relation between the A/B of the BST film and the current level of the saturated current region is small. From the above results, by using $SrRuO_3$ containing oxygen for the electrodes, or by conducting deposition of Ru in an atmosphere containing oxygen, the oxygen deficiency of the BST film becomes less and the electric field range of the saturated current region is broadened. Furthermore, besides $SrRuO_3$, even if one material out of Sr, Ru, and Pt, and a material containing oxygen are used as electrode, similar results are obtained. The annealing may be performed, not after the upper electrode is processed and an inter layer insulating film is deposited on the upper electrode processed.

In addition, even if deposition is conducted where one out of Sr, Ru, and Pt is deposited in an atmosphere containing oxygen, in a similar way, the effects of less oxygen deficiency are obtained.

Moreover, the present invention shall not be limited to the above-mentioned Embodiments. For instance, in the above Embodiments, $Ba_xSr_{1-x}TiO_3$ film was used as a dielectric film, but dielectric film comprising either Ba or Sr, in addition to Ti and O as the main components such as $SrTiO_3$ or $BaTiO_3$ may be used as dielectric films. Besides the above, the present invention can be applied to various modifications within a range not deviating from the gist.

As explained above, according to the present invention, after forming dielectric film in the amorphous state, by conducting annealing in an oxygen atmosphere at a temperature below the crystallization point, the organic substances in the film are released. Subsequently, by conducting annealing at a temperature above the crystallization point, a dielectric film that has no organic residues in the film is formed, and the increase in leakage current can be suppressed. In addition, in case the upper electrode is formed by an upper electrode that contains one material out of Sr, Ru, and Pt, in addition to O, or the upper electrode is made by forming Sr, Ru, Pt into a film in an atmosphere containing oxygen, the oxygen deficiency of the dielectric film surface is suppressed, and if the A/B ratio obtained by AES is less than 0.3 for the dielectric film in contact with the upper electrode and which has a layer thickness of 5 nm or above, the voltage range of the relaxation current region broadens, and a leakage current below $1 \times 10^{-7}$ $A/cm^2$ at about 1V can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitor comprising:

a lower electrode;

a dielectric film provided on the lower electrode and made mainly of crystal containing Ti, O, and at least one element selected from the group consisting of Ba and Sr; and an upper electrode provided on the dielectric film, wherein said dielectric film includes a layer which contacts the upper electrode, has a thickness of at least 5 nm and exhibits a first-order differential Auger electron spectrum, and in the first-order differential spectrum, a ratio A/B is at most 0.3, where A is the absolute value of a difference between a third peak appearing near 420 eV and a fourth peak appearing at an energy level higher than the third peak and near the third peak, and B is the absolute value of a difference between a first peak appearing near 410 eV and a second peak appearing at an energy level lower than the first peak and near the first peak.

2. The capacitor according to claim 1, wherein the crystal is one selected among $Ba_xSr_{1-x}TiO_3$, $SrTiO_3$, and $BaTiO_3$.

3. The capacitor according to claim 1, wherein the upper electrode contains one element selected from the group consisting of Sr, Ru, Pt, and O.

4. A semiconductor device including a capacitor, said capacitor comprising:

a lower electrode;

a dielectric film provided on the lower electrode and made mainly of crystal containing Ti, O, and at least one element selected from the group consisting of Ba and Sr, and an upper electrode provided on the dielectric film, wherein said dielectric film includes a layer which contacts the upper electrode, has a thickness of at least 5 nm and exhibits a first-order differential Auger electron spectrum, and in the first-order differential spectrum, a ratio A/B is at most 0.3, where A is the absolute value of a difference between a third peak appearing near 420 eV and a fourth peak appearing at an energy level higher than the third peak and near the third peak, and B is the absolute value of a difference between a first peak appearing near 410 eV and a second peak appearing at an energy level lower than the first peak and near the first peak.

5. The semiconductor device according to claim 4, wherein the crystal is one selected among $Ba_xSr_{1-x}TiO_3$, $SrTiO_3$, and $BaTiO_3$.

6. The semiconductor device according to claim 4, wherein the upper electrode contains one element selected from the group consisting of Sr, Ru, Pt, and O.

* * * * *

UNITED STATES PATENT AND TRADEMARK OFFICE
CERTIFICATE OF CORRECTION

PATENT NO. : 6,541,813 B1
DATED : April 1, 2003
INVENTOR(S) : Niwa et al.

It is certified that error appears in the above-identified patent and that said Letters Patent is hereby corrected as shown below:

Title page,
Item [57], ABSTRACT,
Line 3, change "containing at Ti," to -- containing Ti, --.
Line 10, change "and the in" to -- and in --.

Column 12,
Line 66, change "Sr, and" to -- Sr; and --.

Signed and Sealed this

First Day of July, 2003

JAMES E. ROGAN
*Director of the United States Patent and Trademark Office*